(12) United States Patent
Groll

(10) Patent No.: US 6,360,423 B1
(45) Date of Patent: Mar. 26, 2002

(54) STICK RESISTANT COATING FOR COOKWARE

(75) Inventor: William A. Groll, McMurray, PA (US)

(73) Assignee: Clad Metals LLC, Canonsburg, PA (US)

(*) Notice: Subject to any disclaimer, the term of this patent is extended or adjusted under 35 U.S.C. 154(b) by 0 days.

(21) Appl. No.: 09/211,749

(22) Filed: Dec. 15, 1998

Related U.S. Application Data

(60) Provisional application No. 60/069,817, filed on Dec. 16, 1997, and provisional application No. 60/090,567, filed on Jun. 24, 1998.

(51) Int. Cl.[7] .................. B23P 25/00; A47J 27/00
(52) U.S. Cl. .................. 29/527.2; 72/40; 220/573.1; 220/573.2; 428/627
(58) Field of Search .................. 428/472, 627, 428/698, 457; 126/390.1; 220/573.1, 573.2; 29/527.2; 72/39, 40, 341

(56) References Cited

U.S. PATENT DOCUMENTS

| | | | |
|---|---|---|---|
| 3,900,592 A | 8/1975 | Kennedy et al. | 427/39 |
| 3,930,806 A | * 1/1976 | Racz | |
| 4,226,082 A | 10/1980 | Nishida | 368/285 |
| 4,428,811 A | 1/1984 | Sproul et al. | 204/192 R |
| 4,450,205 A | 5/1984 | Itaba et al. | 428/552 |
| 4,774,151 A | 9/1988 | Cuomo et al. | 428/698 |
| 4,839,245 A | 6/1989 | Sue et al. | 428/698 |
| 4,895,765 A | 1/1990 | Sue et al. | 428/627 |
| 4,981,756 A | 1/1991 | Rhandhawa | 428/336 |
| 5,071,693 A | 12/1991 | Sue et al. | 428/212 |
| 5,152,774 A | * 10/1992 | Schroeder | 428/457 |
| 5,242,753 A | 9/1993 | Sue et al. | 428/336 |
| 5,264,297 A | 11/1993 | Jindal et al. | 428/698 |
| 5,300,951 A | 4/1994 | Yamazaki | 346/1.1 |
| 5,352,523 A | 10/1994 | Zurecki et al. | 428/408 |
| 5,368,939 A | 11/1994 | Kawamura et al. | 428/408 |
| 5,372,873 A | 12/1994 | Yoshimura et al. | 428/216 |
| 5,395,680 A | 3/1995 | Santhanam et al. | 428/212 |
| 5,427,843 A | 6/1995 | Miyajima et al. | 428/216 |
| 5,445,892 A | 8/1995 | Riedl et al. | 428/469 |
| 5,447,803 A | 9/1995 | Nagaoka et al. | 428/698 |
| 5,587,227 A | 12/1996 | Ooya | 428/217 |
| 5,663,000 A | 9/1997 | Yamada et al. | 428/457 |
| 5,665,431 A | 9/1997 | Narasimhan | 427/255 |
| 5,670,252 A | 9/1997 | Makowiecki et al. | 428/336 |
| 5,829,116 A | * 11/1998 | Vilon | 29/527.2 |
| 6,197,428 B1 | * 3/2001 | Faulkner | 428/698 |

FOREIGN PATENT DOCUMENTS

| | | | |
|---|---|---|---|
| DE | 2233699 | * | 1/1973 |
| DE | 3142312 | | 5/1983 |
| EP | 0416887 | | 3/1991 |
| EP | 0870458 | | 10/1998 |
| GB | 2277466 | | 11/1994 |

* cited by examiner

Primary Examiner—David P. Bryant
Assistant Examiner—Eric Compton
(74) Attorney, Agent, or Firm—Webb Ziesenheim Logsdon Orkin & Hanson, P.C.

(57) ABSTRACT

A method for making a stick resistant cook surface or cooking vessel having the stick resistance in which a hard substrate metal is buffed/polished to a high luster surface finish of less than 20 micro inches and then coated with a layer of zirconium nitride. The method further includes the step of polishing a stamped blank to the desired surface smoothness prior to the drawing/shaping step to provide a stick resistant surface in cooking vessels having side walls, such as pots and pans, which are otherwise difficult to buff in the interior due to the side wall geometry.

6 Claims, 1 Drawing Sheet

STICK RESISTANT COATING FOR COOKWARE

CROSS-REFERENCE TO RELATED APPLICATION

This application claims priority on Provisional Application No. 60/069,817 filed Dec. 16, 1997 and Provisional Application No. 60/090,567 filed Jun. 24, 1998.

BACKGROUND OF THE INVENTION

1. Field of the Invention

This invention relates generally to cookware and, more particularly, to cookware having a stick resistant coating applied thereto.

Heretofore, it has been common to apply a lubricative layer of PTFE (polytetrafluoroethylene) to the cooking surface of metal cookware to provide, at least initially, a relatively stick-free surface. Over time, the PTFE loses lubricity and becomes less stick-free or somewhat stick resistant. The PTFE surface is somewhat objectionable because much softer than the metal substrate and is easily scratched and otherwise marred by metal spatulas, forks and other kitchen utensils used for cooking. Once scratched or otherwise marred, the PTFE surface can be chipped off and generally loses its original utility as a stick-free surface.

2. Description of the Related Art

More recently, attempts have been made, as disclosed in UK Patent Application GB 2,277,466A to Tsai, to increase the scratch resistance of PTFE. Other work in the area aimed at improving the hardness and durability of stick resistant coatings for cookware is embodied in U.S. Pat. No. 5,447,803 to Nagaoka et al., which discloses a coating of titanium nitride to steel fry pans. The TiN coating is applied by physical vapor deposition (PVD) or by chemical vapor deposition (CVD) and then heat treated in an atmosphere consisting of oxygen and nitrogen in a controlled ratio to form a protective layer of titanium oxide on the surface of the titanium nitride layer. The titanium nitride layer is said to be hard and, in addition, produces a pleasing golden color to improve the appearance of the fry pan.

Zirconium nitride is a known ceramic coating which has been applied to enhance hardness and wear resistance to various industrial goods such as drill bits, lathe bits and injection molds.

I have discovered that zirconium nitride provides an excellent long-lasting, stick resistant coating for cookware when the substrate metal is properly selected and prepared. In addition, zirconium nitride does not require a separate treatment step to produce an oxide surface as is necessary with prior titanium nitride surfaces. Further, the zirconium nitride coating of my invention provides a pleasing golden color on the cookware which does not discolor when exposed to direct flame, which occurs with titanium nitride coatings. The zirconium nitride coating of the present invention is extremely hard and abrasion resistant, which provides a durable, long-lasting, stick resistant cooking surface, thus making it particularly suitable for restaurant and institutional kitchens. The pleasing gold tone color of the zirconium nitride coating, coupled with its stick resistant properties on the cookware of the present invention, likewise, makes it suitable for the houseware consumer market.

SUMMARY OF THE INVENTION

The present invention is directed to a cooking or baking surface, hereinafter referred to collectively as "cook surface", having a stick resistant coating of a ceramic nitride material, preferably zirconium nitride, thereon. The invention also relates to a method of making the coated cook surface, as well as to the resultant cooking or baking vessels made by the method.

Briefly stated, the cook surface of the invention comprises a hard substrate metal such as stainless steel, carbon steel, titanium or the like, which is buffed to a high luster finish of less than 20 micro inches, preferably in the range of 9–12 micro inches, and still more preferably about 2–6 micro inches. The buffed surface of the substrate metal is cleaned and then coated with the preferred material, zirconium nitride. There is no need to heat treat the applied coating to produce a protective oxide layer, since zirconium nitride is self-passivating in the atmosphere and, thus, forms a protective layer of zirconium oxide without any special treatment.

The substrate metal of the cooking vessel can be a single layered material or it may be bonded as a clad composite to layers of various other metals such as a conductive core material, for example, copper or aluminum, to promote thermal conductivity. Magnetic layers of ferritic stainless steels may also be included in the composite to make the vessel compatible with induction heating ranges.

When the substrate metal is part of a clad composite of various metal layers, as described above, the zirconium nitride coating is preferably applied by the cathodic arc method known in the art as the physical vapor deposition method (PVD). This method uses a vacuum chamber pressure on the order of $10^{-5}$ Torr at a temperature of about 500°–900° F. This temperature range promotes good coating adhesion while staying below the temperature at which stainless steel and aluminum (forming the clad composite) separate.

According to a preferred method according to the invention, when making deep drawn cooking vessels, such as pots and certain pans, it is difficult to buff or polish the entire interior surface to a bright luster finish. In such circumstances, a presently preferred method of the invention comprises the step of forming a flat blank of the substrate metal, in a clad composite form, if applicable, then buffing the cooking surface of the flat blank to a high luster finish and then drawing the thus-polished blank to a desired shape of the finished vessel. The shaped vessel is then cleaned and the buffed surface is coated with the zirconium nitride material to provide a stick resistant surface.

These features, as well as other advantages and attributes of the invention, will become more readily apparent when reference is made to the drawings when taken with the following detailed description.

DETAILED DESCRIPTION OF THE INVENTION

With reference to the drawings, a multi-layer, or -ply, clad metal composite cook surface of the invention, generally designated by reference number 2, is shown. A single layer cook surface 4 is depicted in FIG. 2, which is also suitable in the practice of the present invention.

Figure 1:
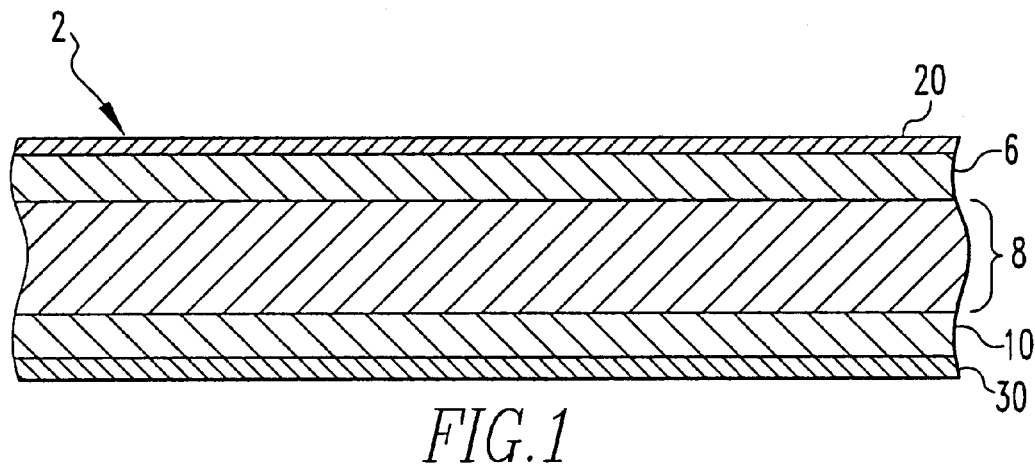
FIG. 1 is an enlarged cross-sectional side view of a clad metal composite of a stick resistant cook surface according to the present invention.

The multi-ply composite 2 of FIG. 1 having a stick resistant layer 20 thereon may comprise a substrate metal layer 6 at the cook surface of, for example, stainless steel, such as 304 grade. A heat conductive core layer 8 of Alclad Aluminum or copper or copper alloy is bonded to the substrate metal layer 6 and an exterior layer 10 of stainless steel is bonded to the core layer 8. The exterior layer 10 may be a 304 grade stainless steel or it may be a magnetic or ferritic grade 436, making the composite 2 suitable for use on an induction heating range, as well as a conventional gas or electric radiant heating range.

The multi-ply composite 2 of FIG. 1 may also represent a flat griddle plate wherein the substrate metal layer 6 and exterior layer 10 are of stainless steel and the core layer 8 is copper or copper alloy. The zirconium nitride stick resistant layer 20 provides excellent properties for a commercial griddle plate.

Figure 2:
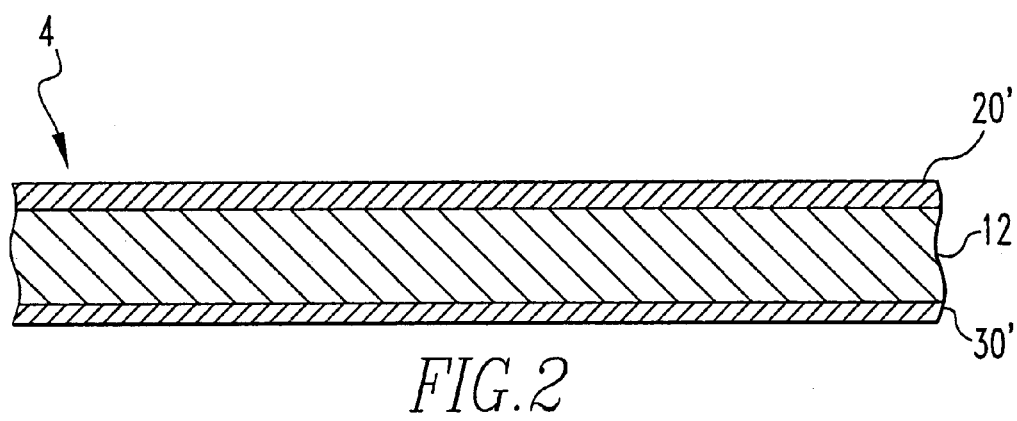
FIG. 2 is a view similar to FIG. 1 but merely showing a single substrate metal layer having a stick resistant cook surface according to the present invention.

The substrate metal layer 12 of FIG. 2 forms the entire cross section of the cook surface and may be in the form of a griddle plate, grill grate or other cookware. It is well-known, however, in the cooking art that multi-ply composite metals having high thermal conductivity cores, of the type depicted in FIG. 1, offer superior cooking performance when used in cooking vessels such as pots, pans and oven bakeware.

The substrate metal layers 6 or 12 must be highly compatible with the thermal expansion properties of the stick resistant layer 20 of zirconium nitride of FIG. 1 or 20' of FIG. 2. Otherwise, the zirconium nitride coating will not adhere properly. The substrate metal layer should also be a hard metal. Preferred substrate metals include titanium or any of a wide variety of grades of stainless steel, including the above grades 304 and 436. A soft material such as aluminum or copper should be avoided for use as a substrate metal layer 6 or 12.

In order to provide superior stick resistant properties, the interior surface, i.e., the substrate metal layer 6 or 12, must be finished by fine polish grinding preferably followed by buffing to a high surface smoothness, providing a bright luster finish. As the substrate metal surface smoothness increases, the stick resistant properties of the stick resistant layer 20 and 20', likewise, increase. The surface preparation preferably involves a two-step grinding operation carried out on a commercial device, known as a Hi-Lite brand buffing machine, using a 180 grit alumina abrasive paper flooded with a petroleum based lubricant. A stationary nose of the machine carries the abrasive while the metal substrate is spun at speeds of 500 to 1,000 rpm. The nose carrying the abrasive traverses the spinning metal two times. The metal is then further treated using a finer abrasive of 220 grit using the same machine parameters as above, also employing a double traverse. The treated surface has a bright luster finish of less than 20 micro inches and preferably 10–16 micro inches, more preferably, an ultra bright surface finish of 2–6 micro inches with a surface smoothness of 3 micro inches being superior. It is, of course, understood that a higher luster surface requires additional polishing with a buffing wheel and medium buffing abrasive which adds some additional cost to the finished cookware. Thus, a compromise between added cost and added stick resistance must be made in a commercial setting.

The applied zirconium nitride forming stick resistant layer 20, 20' provides a cosmetically pleasing gold color to the cookware and, thus, in addition to the stick resistant layers 20, 20', the zirconium nitride may be applied as an exterior decorative layer 30 and 30', FIGS. 1 and 2, respectively. The exterior surfaces of the underlying exterior metal layer need not be buffed to the high degree of smoothness required on the cook surface since stick resistance is not required on the exterior surfaces of the cooking vessel. Of course, it is understood that the zirconium nitride can be applied to selected surfaces of the cookware to achieve any desired appearance, simply by masking those surfaces which are not to be coated. These masking techniques are well-known in the coating art.

A high degree of surface cleanliness is required prior to coating the metal substrate layer. The dirty areas will act as a mask and prevent adhesion of the layers 20, 20', 30, 30'. The surface is cleaned with a detergent and rinsed with deionized water after the buffing/polishing treatment, then later cleaned further in an ultrasonic bath.

The zirconium nitride applied to the cooking vessel is done by the cathodic arc method also known as the physical vapor deposition method (PVD). In the case of cladded material, the PVD method is employed. This method uses a vacuum chamber pressure of about $10^{-5}$ Torr and a temperature of 500°–900° F. This temperature range promotes good coating adhesion while staying under the temperature at which the stainless steel and aluminum layers in the clad composite would separate. The parts to be coated are first cleaned with a plasma bombardment of an inert gas initial bombardment activates the surface by reducing the surface oxide. The zirconium is then vaporized and a layer which is several angstroms thick is deposited on the surface. A nitrogen atmosphere is then introduced and the zirconium nitride ceramic of layer 20, 20' or 30, 30' is built. The cycle is completed when a measured amount of oxygen is introduced into the chamber and a zirconium oxide layer is formed. A coating thickness of one and one-half to three microns is achieved for layer 20, 20'. A preferred thickness for a stick resistant layer of zirconium nitride is two microns.

Zirconium nitride offers a number of significant advantages over the known titanium nitride material. The zirconium nitride can be applied to a substrate at a lower temperature range than that required for titanium nitride. This is particularly beneficial in the case of bonded metals which separate or distort at higher temperatures. In addition, titanium nitride can react galvanically with the substrate, causing surface degradation, discoloration and corrosion. Because of a higher deposition rate, zirconium is more economical to apply. Zirconium exhibits a self-passivating characteristic which tends to prevent galvanic current paths from forming. U.S. Pat. No. 5,447,803 of Nagaoka et al. teaches a final back flushing of oxygen to stabilize the surface with a layer of titanium oxide. This layer can be chemically or abrasively damaged, which leaves the titanium/substrate system susceptible to galvanic corrosion.

In conclusion, zirconium nitride, when applied as a surface coating to cookware, bakeware, grills, griddles or other food preparation surfaces offers: (a) a high durable wear resistance; (b) high corrosion resistance; and (c) substantial resistance to sticking of foods to the surface.

Zirconium nitride is superior to PVD or CVD deposited titanium nitride for the following reasons: (a) zirconium nitride can be applied at a lower temperature than titanium nitride; (b) zirconium nitride is self-passivating, which offers superior corrosion resistance. Titanium nitride has far less tendency to form an oxide after the initial coating treatment; and (c) zirconium nitride can be applied more economically than titanium nitride. Thus, zirconium nitride offers a superior stick resistant layer 20, 20' over the previously proposed titanium nitride coatings of the prior art.

I have found that it is difficult to uniformly buff the bottom cooking surface of deep drawn cookware, such as pots, when applying an ultra high luster finish (2–4 micro inches), since the high walls of the vessel interfere with the entry of the buffing wheel. Accordingly, in the manufacture of deep drawn cookware, according to the present invention, I have found it advantageous to first polish and buff the flat metal blank to a smooth, high or ultra high luster finish prior to subjecting the blank to a drawing operation for forming the cookware vessel. The polished/buffed surface of the blank remains substantially undisturbed during the drawing operation and may then be coated with titanium nitride (after appropriate cleaning).

Comparative Tests

Test I—Surface Smoothness

A first multi-ply cladded fry pan comprising an interior substrate metal layer (cook surface) of 304 stainless steel, a core layer of Alclad Aluminum and an exterior surface layer of 436 stainless steel was made in a conventional manner and then subjected to the titanium nitride coating process. Before coating, the exterior surface of the fry pan was buffed to a bright luster and the interior surface was finished with a concentric pattern known in the industry as a "Hi-Lite" finish using a lubricated 150 grit abrasive. A second fry pan of the same size and multi-layer clad composition was made and then aggressively buffed using a hard cloth buff wheel and a medium buffing compound on the interior and exterior surfaces, bringing both surfaces to an ultra high reflective luster finish of about 3 microns and then subjected to the same titanium nitride coating process as the first fry pan. Both coated pans were compared to an uncoated multi-ply stainless steel third fry pan in a standard objective test, which involved burning a measured sample of brown sugar and water on the cook surface of the fry pans. Both the first and second titanium nitride coated pans clearly exhibited better release properties than the bare, uncoated multi-ply stainless steel third fry pan. However, the second fry pan that had the higher luster buffed interior prior to titanium nitride coating showed better release characteristics than the abrasively finished first fry pan. A buffed, bright luster surface finish suitable for subsequent titanium nitride coating in accordance with my invention thus preferably has a surface smoothness of about 3 micro inches. By way of comparison, the surface finish of the above-mentioned "Hi-Lite" finish had a surface smoothness on the order of about 9–12 micro inches.

This comparative test thus demonstrates that a smoother surface on the substrate layer provides improved stick resistance properties in the ceramic nitride layer.

Test II—Egg Cooking Cleanup

A standard ten-inch diameter stainless steel-aluminum core-stainless steel fry pan was tested against an identically constructed pan but having a 1.5 micron thick coating of zirconium nitride on the stick resistant layer 20 and also applied on the exterior surface 30. A release additive, Pam®, was sprayed briefly on each pan and an egg was then fried in each. After cooking, the pans were cleaned using a scrub pad and rated with an assigned value of 1 to 5, with 1 being rated the best and 5 the worst. Five cooking trials were run on each pan. The stainless steel standard fry pan rated an average 3 in cleanability while the zirconium nitride coated stainless pan rated an average 1.2, which is considered excellent and actually equivalent to a new, non-stick PTFE surface.

Test III—Coating Thickness

The purpose of this test was to find out how well the release properties of the ZrN of various thicknesses hold up with use.

The experiment tested the release properties of two stainless steel aluminum core fry pans having different thicknesses of zirconium nitride thereon. The first pan had 0.56 microns of ZrN while the second pan had a 2 micron thick layer of ZrN thereon. The pans were put through a baked bean scrape/wash test. One tablespoon of Bush's Best Baked Beans was placed in the center of each pan and heated until all of the syrup had turned into a black residue. Then a spoon was dragged across the burnt beans. The success of the scrape was recorded on a scale of 1 to 5 as follows:

1=All beans come off the pan with the scrape
2=Beans flake off in large chunks
3=Beans are removed from the path of the spoon only
4=Most, but not all, beans are removed from the path of the spoon
5=No beans are removed.

After recording the value for the scrape, the pan was soaked for one minute in hot water and Palmolive® dish detergent. After soaking, the pan was washed with a scrubbing pad and another rating was assessed using the same scale. Some of the tests left a silver stain on the pan. A scrubbing and polishing compound, Bar Keepers Friend®, was used to remove the stain, so it would not be confused for a weak area in the coating.

The first pan tested having a ZrN coating thickness of 0.5 microns failed in its stick resistant properties after ten trials and bare stainless began to appear along the cook surface. The second pan tested, having a zirconium nitride layer of 2 microns in thickness, successfully completed 60 trials without failure.

The scrape test and soak/cleaning test results for the second pan are set forth below in tables (a)–(c) covering bean cooking trials 1–60.

| | Trials | | | | | | | |
|---|---|---|---|---|---|---|---|---|
| (a) | | | (b) | | | (c) | | |
| Trials | Scrape | Wash | Trials | Scrape | Wash | Trials | Scrape | Wash |
| 1 | 4 | 2 | 21 | 3 | 1 | 41 | 4 | 4 |
| 2 | 3 | 4 | 22 | 4 | 2 | 42 | 5 | 2 |
| 3 | 3 | 2 | 23 | 3 | 2 | 43 | 4 | 3 |
| 4 | 3 | 2 | 24 | 4 | 1 | 44 | 4 | 3 |
| 5 | 4 | 1 | 25 | 3 | 3 | 45 | 4 | 3 |
| 6 | 4 | 1 | 26 | 4 | 2 | 46 | 4 | 2 |
| 7 | 4 | 1 | 27 | 3 | 1 | 47 | 4 | 3 |
| 8 | 4 | 1 | 28 | 3 | 2 | 48 | 4 | 3 |
| 9 | 4 | 1 | 29 | 4 | 1 | 49 | 3 | 3 |
| 10 | 4 | 1 | 30 | 3 | 3 | 50 | 5 | 3 |
| 11 | 3 | 2 | 31 | 4 | 3 | 51 | 4 | 4 |
| 12 | 3 | 3 | 32 | 5 | 3 | 52 | 4 | 3 |
| 13 | 4 | 1 | 33 | 5 | 3 | 53 | 4 | 3 |
| 14 | 4 | 1 | 34 | 4 | 3 | 54 | 3 | 2 |
| 15 | 3 | 2 | 35 | 4 | 3 | 55 | 4 | 4 |
| 16 | 3 | 2 | 36 | 4 | 2 | 56 | 4 | 4 |
| 17 | 3 | 1 | 37 | 3 | 2 | 57 | 4 | 2 |
| 18 | 3 | 2 | 38 | 3 | 3 | 58 | 4 | 3 |
| 19 | 4 | 1 | 39 | 5 | 3 | 59 | 4 | 3 |
| 20 | 3 | 2 | 40 | 5 | 3 | 60 | 4 | 4 |

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the appended claims and any and all equivalents thereof.

I claim:

1. A method for making a cooking utensil having a stick resistant cook surface comprising the steps of:
   (a) providing a metal sheet;
   (b) stamping a flat blank from the metal sheet;
   (c) forming a bright luster finish on said blank;
   (d) drawing said bright luster finished blank to shape a cooking utensil of a desired configuration; and
   (e) applying a layer of zirconium nitride to at least a cooking surface of said cooking utensil to provide a stick resistant cook surface thereon.

2. The method of claim 1 wherein the forming step (c) comprises two finishing treatments, wherein a second of said treatments employs a finer polishing abrasive than used in a first of said finishing treatments.

3. The method of claim 2 including a third finishing treatment comprising buffing with a buffing wheel and a buffing abrasive compound to obtain an ultra bright surface finish of 2–4 micro inches.

4. The method of claim 1 wherein the metal sheet comprises a multi-layered metal composite.

5. The method of claim 1 wherein the cooking utensil is one of a fry pan, saucepan, saucier, casserole, saute pan, stock pot, brazier pan, stir fry pan and omelet pan.

6. The method of claim 1 wherein the metal sheet is a multi-layered metal composite sheet having an outer layer of stainless steel and an inner core layer of a high heat-conductive metal or metal alloy comprising one selected from the group consisting of aluminum and copper.

* * * * *

UNITED STATES PATENT AND TRADEMARK OFFICE
CERTIFICATE OF CORRECTION

PATENT NO.    : 6,360,423 B1
DATED         : March 26, 2002
INVENTOR(S)   : William A. Groll It is certified that error appears in the above-identified patent and that said Letters Patent is hereby corrected as shown below:

<u>Column 4,</u>
Line 25, "gas initial" should read -- gas. This initial --.

<u>Column 6,</u>
Line 37, before "Trials" insert -- Baked Beans Scrape/Wash Test on Batch 4 Pan 3 --.

Signed and Sealed this

Seventeenth Day of September, 2002

Attest:

JAMES E. ROGAN
Attesting Officer    Director of the United States Patent and Trademark Office